United States Patent
Takao et al.

(10) Patent No.: US 12,032,895 B2
(45) Date of Patent: Jul. 9, 2024

(54) OSCILLATION CIRCUIT DESIGN SUPPORT METHOD, OSCILLATION CIRCUIT DESIGN SUPPORT SYSTEM, AND OSCILLATION CIRCUIT DESIGN SUPPORT PROGRAM

(71) Applicant: Murata Manufacturing Co., Ltd., Nagaokakyo (JP)

(72) Inventors: Shinsuke Takao, Nagaokakyo (JP); Masahiro Kurosaka, Nagaokakyo (JP); Hironobu Nishio, Nagaokakyo (JP); Tsuyoshi Nanatsuyaku, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 514 days.

(21) Appl. No.: 17/492,809

(22) Filed: Oct. 4, 2021

(65) Prior Publication Data

US 2022/0027549 A1    Jan. 27, 2022

Related U.S. Application Data (63) Continuation of application No. PCT/JP2020/042892, filed on Nov. 18, 2020.

(30) Foreign Application Priority Data

Apr. 28, 2020   (JP) ................. 2020-079233

(51) Int. Cl.
G06F 30/398     (2020.01)
H03B 1/00       (2006.01)

(52) U.S. Cl.
CPC ............ *G06F 30/398* (2020.01); *H03B 1/00* (2013.01); *H03B 2200/0068* (2013.01)

(58) Field of Classification Search
CPC .... G06F 30/33; G06F 30/3312; G06F 30/398; G06F 30/36; H03B 1/00; H03B 2200/0068; H03B 5/32; H03H 3/02
(Continued)

(56) References Cited

U.S. PATENT DOCUMENTS

2010/0026378 A1*  2/2010  Parker ............... G06F 30/398
                                                716/100
2018/0137212 A1   5/2018  Zhang et al.

FOREIGN PATENT DOCUMENTS

JP    H01214977 A    8/1989
JP    2006139567 A   6/2006
(Continued)

OTHER PUBLICATIONS

International Search Report issued for PCT/JP2020/042892, date of mailing Feb. 2, 2021 (Japanese language search report).

*Primary Examiner* — Paul Dinh
(74) *Attorney, Agent, or Firm* — ArentFox Schiff LLP (57) ABSTRACT

An oscillation circuit design support method is provided for designing an oscillation circuit condition in a circuit board equipped with an integrated circuit (IC) chip for oscillation and an oscillator. The method includes receiving an input of IC chip information about an IC chip for oscillation, providing sample oscillator data and sample oscillation circuit condition data that are determined in accordance with the IC chip information, receiving an input of frequency measurement information measured based on the sample oscillation circuit condition data when an oscillator corresponding to the sample oscillator data is installed at a circuit board, and a providing information relating to matched oscillation circuit condition data determined based on at least the frequency measurement information.

20 Claims, 6 Drawing Sheets

(58) Field of Classification Search
USPC .......................................................... 716/100
See application file for complete search history.

(56) References Cited

FOREIGN PATENT DOCUMENTS

| | | |
|---|---|---|
| JP | 2017068646 A | 4/2017 |
| JP | 2018077748 A | 5/2018 |

* cited by examiner

| SAMPLE OSCILLATOR DATA | | |
|---|---|---|
| SAMPLE NUMBER | FREQUENCY [MHz] | $\triangle F$ [ppm] |
| 1 | 27.119786 | −7.9 |
| 2 | 27.119883 | −4.3 |
| 3 | 27.119885 | −4.2 |
| 4 | 27.119842 | −5.8 |
| 5 | 27.119840 | −5.9 |
| 6 | 27.119814 | −6.9 |
| 7 | 27.119964 | −1.3 |
| 8 | 27.119775 | −8.3 |
| 9 | 27.119981 | −0.7 |
| 10 | 27.119920 | −3.0 |

OSCILLATION CIRCUIT DESIGN SUPPORT METHOD, OSCILLATION CIRCUIT DESIGN SUPPORT SYSTEM, AND OSCILLATION CIRCUIT DESIGN SUPPORT PROGRAM

CROSS REFERENCE TO RELATED APPLICATIONS

The present application is a continuation of PCT/JP2020/042892 filed Nov. 18, 2020, which claims priority to Japanese Patent Application No. 2020-079233, filed Apr. 28, 2020, the entire contents of each of which are incorporated herein by reference.

TECHNICAL FIELD

The present invention relates to an oscillation circuit design support method, an oscillation circuit design support system, and an oscillation circuit design support program.

BACKGROUND

Heretofore, systems for supporting design of device specifications satisfying customer's demand have become known. For example, a system described in Japanese Unexamined Patent Application Publication No. 2018-77748 (hereinafter "Patent Document 1") presents provisional device specifications that satisfy particular specifications required by a customer in accordance with, for example, an individual database, even if the particular specifications required by the customer fail to indicate part of the collection of device specifications. The customer can correct the provisional device specifications by inputting details for change. As a result, device specifications are determined without increasing communication with the customer.

Incidentally, in the processes of manufacturing circuit boards, firstly, integrated circuits (ICs) (e.g., semiconductor devices) to be installed at a circuit board are selected in accordance with customer's demand; and subsequently, an oscillation circuit is designed. When an oscillation circuit is designed, an oscillation circuit condition is set with consideration for, for example, stray capacitance (electrostatic capacity) of the oscillation circuit caused especially in the circuit board. The oscillation circuit condition includes as parameters, for example, a capacitance of a capacitor in the oscillation circuit, a resistance of a resistor, a load capacitance of an oscillator, a specification value of equivalent series resistance (ESR), and a negative resistance of the IC.

To set an oscillation circuit condition with consideration for stray capacitance of the oscillation circuit caused especially in the particular circuit board, it is assumed that, for example, the particular circuit board be provided for an external business operator with a request for optimization of the oscillation circuit, and an optimized oscillation circuit condition be set in accordance with the result of the optimization.

However, if the circuit board is provided for an external business operator, this may cause disadvantages to the customer such as possibilities of information leakage about the circuit board. For this reason, a need exists for a further improvement.

SUMMARY OF THE INVENTION

Accordingly, the present invention has been made in consideration of the above circumstances. Thus, it is an object thereof to provide an oscillation circuit design support method, an oscillation circuit design support system, and an oscillation circuit design support program that optimizes an oscillation circuit while inhibiting information leakage about a circuit board to the outside.

According to an exemplary aspect, an oscillation circuit design support method is provided for supporting design of an oscillation circuit condition in a circuit board equipped with an IC chip for oscillation and an oscillator. The oscillation circuit design support method includes a first reception step of receiving an input of IC chip information about an IC chip for oscillation, a first provision step of providing sample oscillator data and sample oscillation circuit condition data that are determined in accordance with the IC chip information, a second reception step of receiving an input of frequency measurement information measured in accordance with the sample oscillation circuit condition data when an oscillator corresponding to the sample oscillator data is installed at a circuit board, and a second provision step of providing information relating to matched oscillation circuit condition data determined in accordance with at least the frequency measurement information.

The exemplary embodiments of the present invention optimize the oscillation circuit while inhibiting information leakage about the circuit board to the outside.

DETAILED DESCRIPTION OF EMBODIMENTS

Hereinafter, an oscillation circuit design support method, an oscillation circuit design support system, and an oscillation circuit design support program according to an exemplary embodiment of the present invention will be described with reference to the accompanying drawings. The oscillation circuit design support system of the exemplary embodiment is a system for supporting design of an optimum oscillation circuit condition in a circuit board equipped with an integrated circuit (IC) chip for oscillation and an oscillator. This system receives an input of IC chip information about an IC chip for oscillation from a customer. Next, the system provides sample oscillator data and sample oscillation circuit condition data determined in accordance with the received IC chip information. The system then receives from the customer an input of input information including frequency measurement information measured in accordance with the sample oscillation circuit condition data when an oscillator corresponding to the sample oscillator data is installed at a circuit board. Subsequently, the system provides the customer with information relating to matched oscillation circuit condition data determined in accordance with at least the frequency measurement information.

Figure 1:
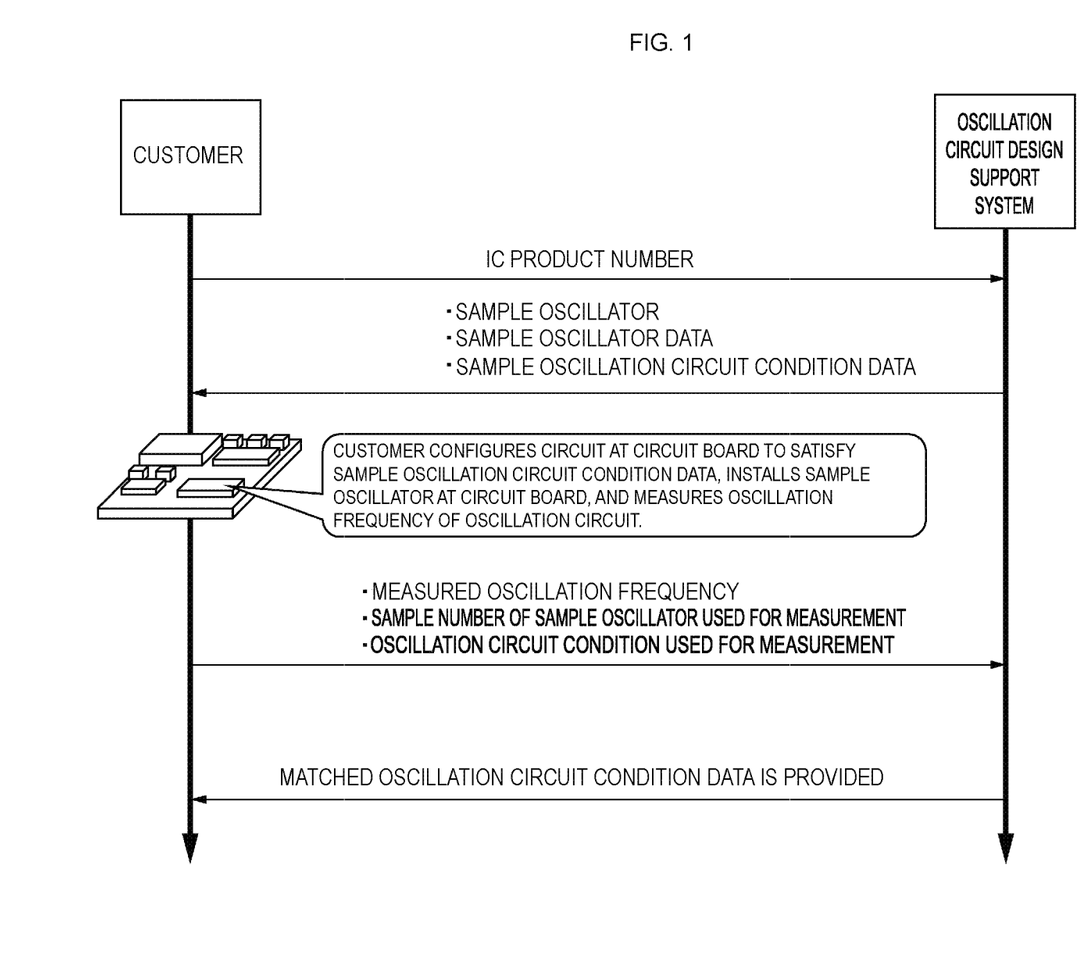
FIG. 1 is a drawing for explaining the outline of a process of an oscillation circuit design support system according to an exemplary embodiment.

FIG. 1 is a drawing for explaining the outline of a process of the oscillation circuit design support system according to the exemplary embodiment. As illustrated in the drawing, the oscillation circuit design support system firstly receives information about an IC product number of an oscillator from a customer. In this case, the oscillation circuit design support system can receive one or more IC product numbers of oscillators from the customer. Next, an oscillation circuit design support system provides the customer with sample oscillators individually corresponding to the one or more IC product numbers received from the customer together with data regarding the frequency characteristic of each sample oscillator and an oscillation circuit condition corresponding to each sample oscillator. The oscillation circuit condition is a circuit condition determining the frequency characteristic of an oscillation circuit. According to the exemplary aspect, the oscillation circuit condition is defined by parameters such as a capacitance of a capacitor in the oscillation circuit, a resistance of a resistor, a load capacitance of an oscillator, a specification value of equivalent series resistance (ESR), and an IC internal resistance of the oscillator. The customer designs by themselves a circuit board to have a circuit configuration corresponding to the oscillation circuit condition provided by the oscillation circuit design support system, installs at the circuit board the oscillator provided by the oscillation circuit design support system, and measures the frequency at the oscillation circuit installed at the circuit board. The oscillation circuit design support system obtains from the customer the frequency of the oscillation circuit measured by the customer together with the sample number of the sample oscillator used for measurement and the oscillation circuit condition used for measurement. The oscillation circuit design support system then provides the customer with an oscillation circuit matching performed based on differences in stray capacitance among circuit boards. As a result, the oscillation circuit matching is configured to provide a customer with an optimized oscillation circuit condition as matched oscillation circuit condition data by adjusting the parameters such as a capacitance of a capacitor in the oscillation circuit, a resistance of a resistor, a load capacitance of an oscillator, a specification value of ESR, and an IC internal resistance of the oscillator.

Figure 2:
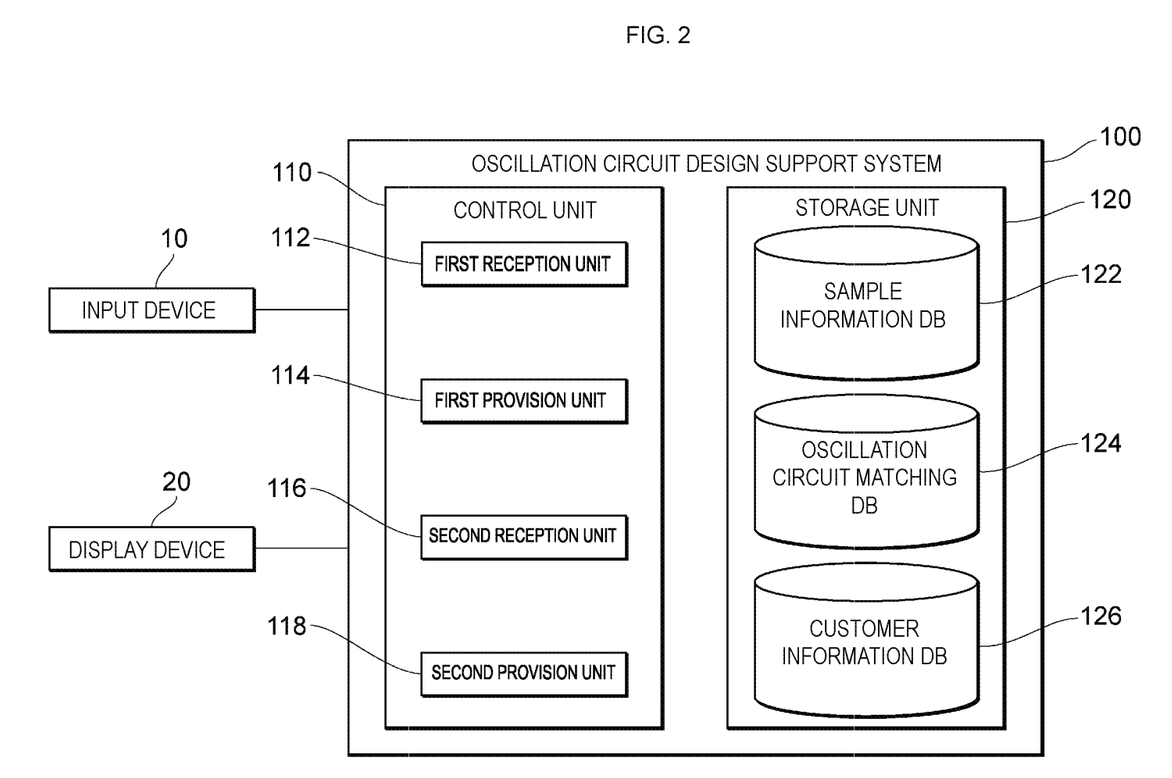
FIG. 2 is a block diagram illustrating the outline of a configuration of the oscillation circuit design support system according to the exemplary embodiment.

FIG. 2 is a block diagram illustrating the outline of a configuration of the oscillation circuit design support system. As illustrated in the drawing, an oscillation circuit design support system 100 is connected to, for example, an input device 10 and a display device 20. These devices are connected to each other through, for example, communication lines, wireless communication networks or the like. It is noted that the configuration illustrated in FIG. 2 is intended to be an example and that a part of the configuration can be removed or another configuration can be added in various alternatives of the exemplary aspect.

The input device 10 is an information terminal, such as a personal computer (PC). The input device 10 inputs to the oscillation circuit design support system 100 IC chip information about an IC chip for oscillation used as a sample in accordance with an input operation by a customer.

The display device 20 may be, for example, a liquid crystal display or the like. The display device 20 displays to a customer an image generated by the oscillation circuit design support system 100 to indicate an optimized oscillation circuit condition as matched oscillation circuit condition data.

The oscillation circuit design support system 100 includes, for example, a control unit 110 and a storage unit 120. The control unit 110 is implemented by a hardware processor such as a central processing unit (CPU) running a program (software). It is noted that part or all of a group of these system elements can be implemented by hardware (circuit unit including circuitry) such as a large scale integration (LSI), application specific integrated circuit (ASIC), field-programmable gate array (FPGA), or graphics processing unit (GPU), or by software and hardware cooperating with each other. Moreover, the program can be stored in advance in a storage device such as a hard disk drive (HDD) or flash memory of the oscillation circuit design support system 100. The program may be stored in an attachable and detachable storage medium such as a digital versatile disc (DVD) or compact disc read-only memory (CD-ROM) and installed on the HDD or flash memory of the oscillation circuit design support system 100 when the storage medium is attached to a drive device.

According to the exemplary aspect, the control unit 110 includes, for example, a first reception unit 112, a first provision unit 114, a second reception unit 116, and a second provision unit 118.

In operation, the first reception unit 112 receives an input of IC chip information about an IC chip for oscillation from the input device 10. The IC chip information is, for example, information about a product number of the IC. When receiving an input of IC chip information from the input device 10, the first reception unit 112 can be configured to access a sample information database (DB) 122 and determine sample information regarding the IC chip for oscillation selected by the customer. In accordance with the obtained sample information, the first reception unit 112 determines an oscillation circuit condition corresponding to the IC chip for oscillation selected by the customer.

Figure 3:
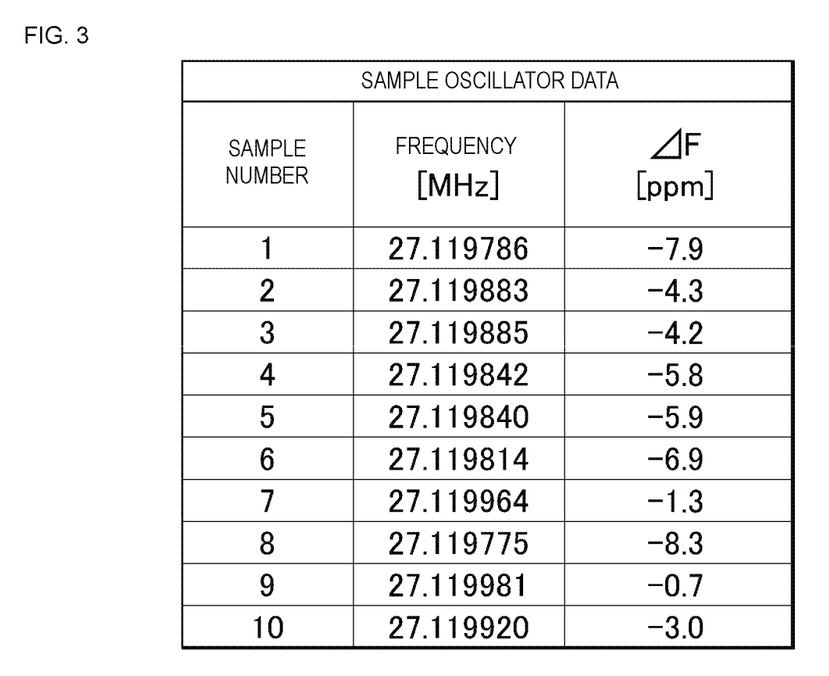
FIG. 3 illustrates an example of sample information about IC chips for oscillation.

FIG. 3 illustrates an example of sample oscillator data about IC chips for oscillation. In the example illustrated in the drawing, the sample oscillator data includes, for example, a sample number, an oscillation frequency, and a frequency difference ΔF of the oscillation frequency from a nominal frequency. The sample number is identification information of a sample oscillator. The oscillation frequency is an oscillation frequency when a quartz-crystal oscillator having normal load capacitance operates in an oscillation circuit. The frequency difference ΔF of the oscillation frequency is a difference from a nominal frequency at, for example, a normal temperature of 25° C.

Figure 4:
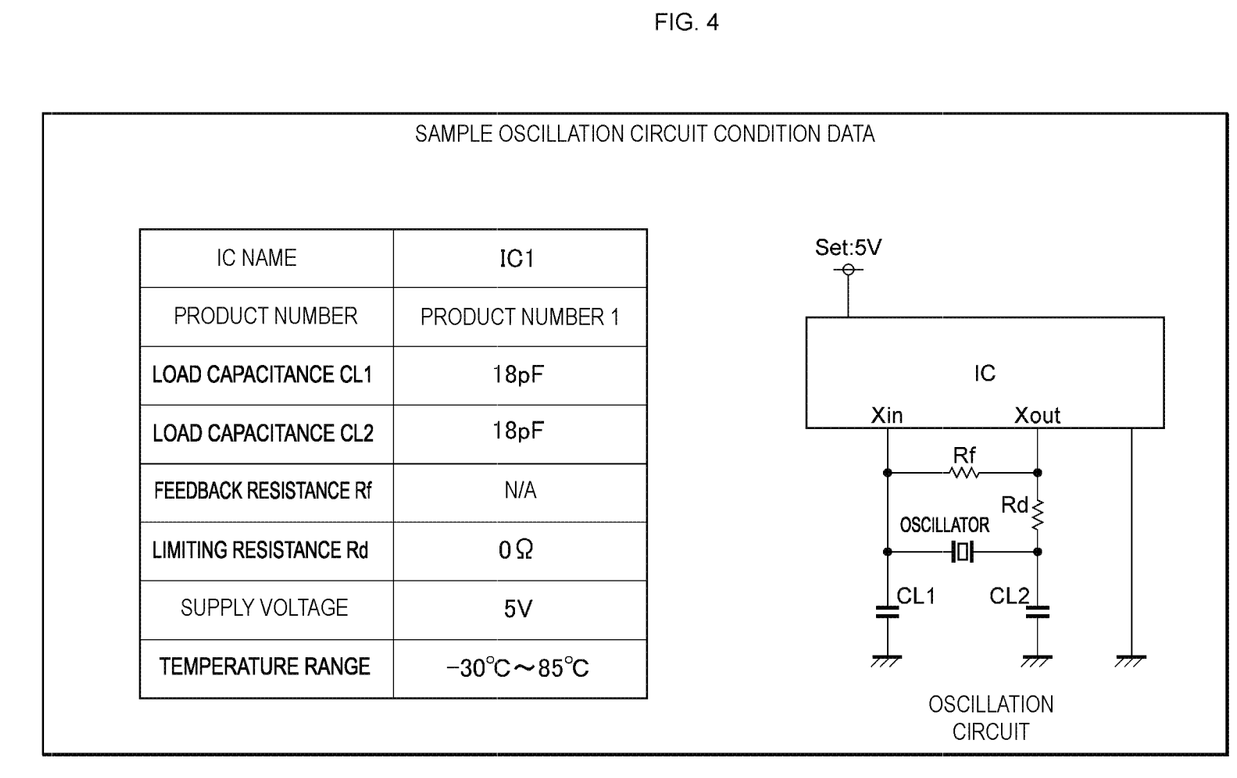
FIG. 4 indicates an example of an oscillation circuit condition regarding an IC chip for oscillation.

FIG. 4 illustrates an example of sample oscillation circuit condition data corresponding to a sample oscillator. In the example illustrated in the drawing, in the sample oscillation circuit condition data, for example, an IC name of a sample oscillator and a product number of the sample oscillator are associated with load capacitances CL1 and CL2, a feedback resistance Rf, a limiting resistance Rd, a supply voltage range, and a temperature range in an equivalent circuit of the sample oscillator.

Moreover, the first provision unit 114 is configured to provide a customer with sample oscillator data and sample oscillation circuit condition data determined by the first reception unit 112 in accordance with IC chip information of an IC chip for oscillation. In this case, the first provision unit 114 also supplies an instruction to provide a sample oscillator for a customer. When the first provision unit 114 provides the sample oscillator data and the sample oscillation circuit condition data, the customer by themselves can configure a circuit at a circuit board to satisfy the sample oscillation circuit condition data, install the sample oscillator at the circuit board, and measure a value of a measured frequency in the oscillation circuit. The value of the measured frequency in the oscillation circuit includes, for example, a frequency outputted by a sample oscillator and a radio frequency outputted by an antenna in the customer's board.

Figure 5:
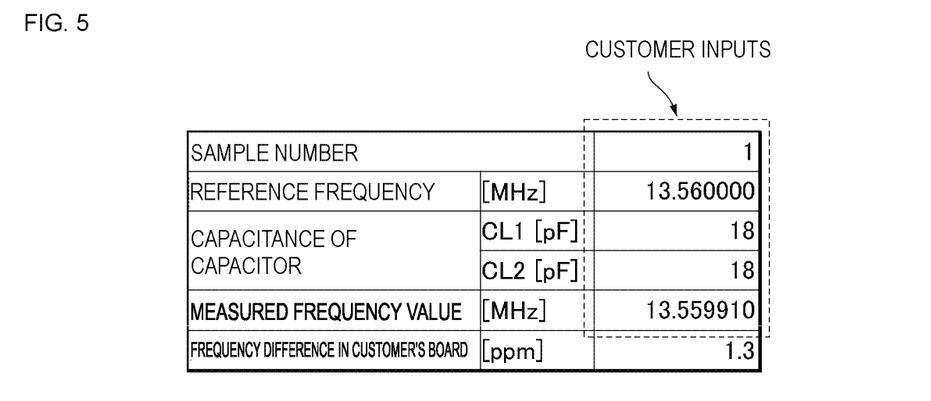
FIG. 5 illustrates an example of frequency measurement information about a value of a measured frequency.

FIG. 5 illustrates an example of input information including frequency measurement information about a value of a measured frequency. As shown in the example illustrated in the drawing, the input information includes, for example, a sample number of a sample oscillator, a reference frequency of the sample oscillator, load capacitances CL1 and CL2 in an equivalent circuit of the sample oscillator indicated by sample oscillation circuit condition data, and a value of a measured frequency. The reference frequency is a frequency in an oscillation circuit when the sample oscillator is installed at a reference board at which a circuit is configured to satisfy the sample oscillation circuit condition data. The value of the measured frequency is a frequency in an oscillation circuit when the sample oscillator is installed at a circuit board at which a circuit is configured by the customer to satisfy the sample oscillation circuit condition data as described above. In accordance with the input information inputted by the customer, a frequency difference ΔF of an oscillation frequency in the customer's board is calculated.

The second reception unit 116 receives an input of input information including frequency measurement information about a value of a measured frequency measured by the customer in accordance with sample oscillation circuit condition data.

When the second reception unit 116 receives an input of input information, the second provision unit 118 is configured to access an oscillation circuit matching DB 124 and determine information relating to matched oscillation circuit condition data. The information relating to matched oscillation circuit condition data includes an oscillation circuit condition that can optimize characteristics of an oscillation circuit. The second provision unit 118 provides the customer with, for example, a single oscillation circuit condition that can optimize characteristics of an oscillation circuit in the most effective manner as matched oscillation circuit condition data. The second provision unit 118 can also provide the customer with candidates of a plurality of oscillation circuit conditions that can optimize characteristics of an oscillation circuit as information relating to matched oscillation circuit condition data, so that the customer can select a most suitable oscillation circuit condition from the plurality oscillation circuit conditions.

Figure 6:
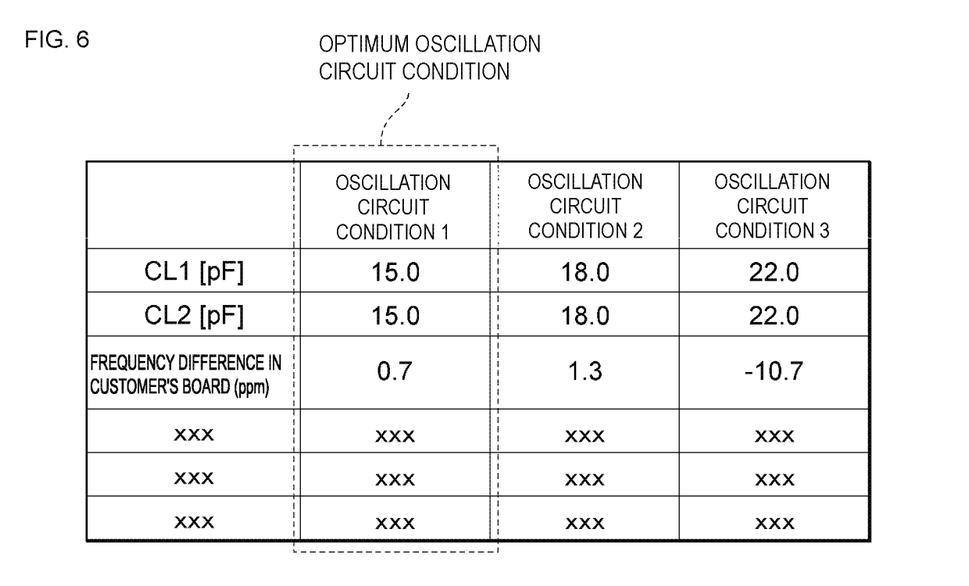
FIG. 6 is a drawing for explaining a process flow of determining an oscillation circuit condition to be provided for a customer.

FIG. 6 illustrates an example of oscillation circuit conditions registered in the oscillation circuit matching DB 124. In the example illustrated in the drawing, three oscillation circuit conditions ("oscillation circuit condition 1", "oscillation circuit condition 2", and "oscillation circuit condition 3") are registered in the oscillation circuit matching DB 124. These oscillation circuit conditions correspond to an oscillation circuit condition inputted by the customer or an oscillation circuit condition similar to the oscillation circuit condition. The oscillation circuit matching DB 124 indicates, for individual oscillation circuit conditions, an estimated value of the frequency difference ΔF of the oscillation frequency of an oscillation circuit when a sample oscillator of a sample number is installed at a reference board at which a circuit is configured to satisfy a corresponding oscillation circuit condition. In this example, by comparing these oscillation circuit conditions with respect to the frequency difference ΔF of the oscillation frequency, the second provision unit 118 provides the customer with an oscillation circuit condition ("oscillation circuit condition 1") including the smallest frequency difference ΔF as matched oscillation circuit condition data.

Although in the example illustrated in the drawing, the same parameters are used for the oscillation circuit conditions registered in the oscillation circuit matching DB 124, parameters of oscillation circuit may be set for each oscillation circuit condition. In this case, the second provision unit 118 provides the customer with matched oscillation circuit condition data in accordance with an oscillation circuit condition including one or more parameters associated with a sample oscillator of a sample number inputted by the customer.

After providing matched oscillation circuit condition data for the customer, the second provision unit 118 receives, in accordance with an operation performed on the input device 10, an indication of whether the customer accepts the provided matched oscillation circuit condition data. The second provision unit 118 stores previous support information, which indicates whether matched oscillation circuit condition data is accepted, in a customer information DB 126 with respect to individual customers. The second provision unit 118 can then determine matched oscillation circuit condition data to provide the customer in consideration for the previous support information stored in the customer information DB 126 with respect to individual customers, in addition to the parameters of the oscillation circuit conditions stored in the oscillation circuit matching DB 124.

Figure 7:
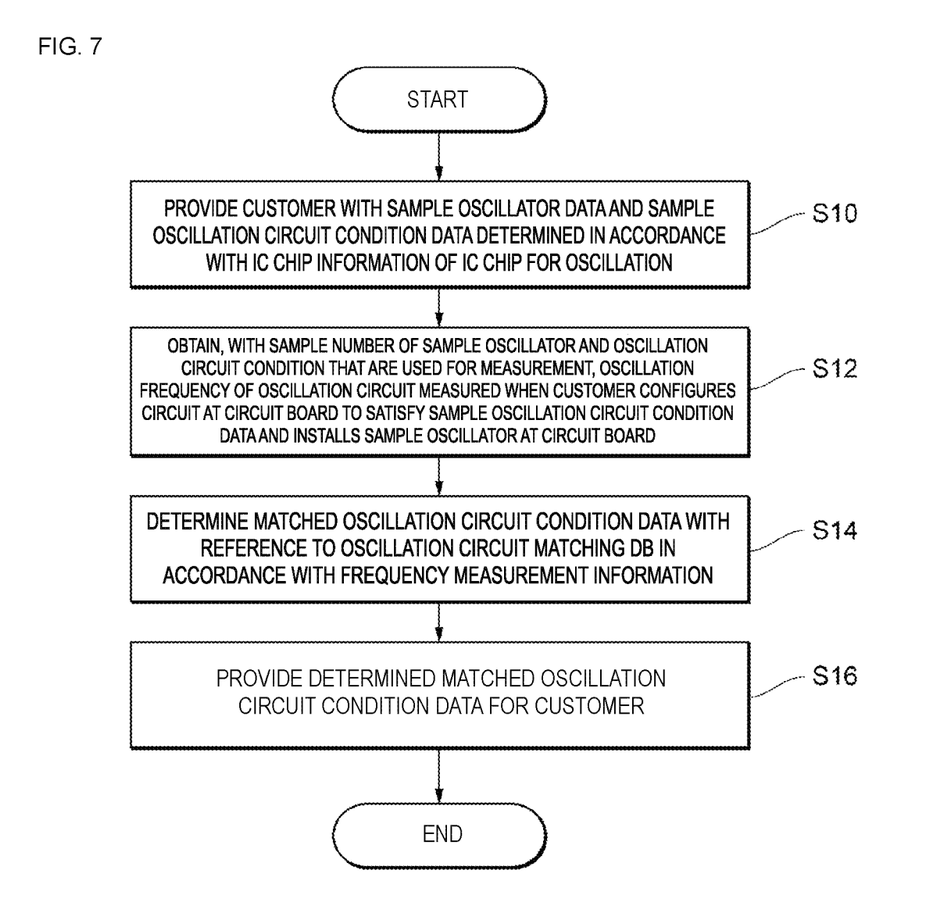
FIG. 7 is a flowchart illustrating an example of a design support process of an oscillation circuit.

FIG. 7 is a flowchart illustrating an example of a design support process of an oscillation circuit. The process of the flowchart illustrated in FIG. 7 is started by being triggered by, for example, the first reception unit 112 receiving an input of IC chip information of an IC chip for oscillation from a customer.

As illustrated in FIG. 7, firstly, the first provision unit 114 provides the customer with sample oscillator data and sample oscillation circuit condition data determined in accordance with IC chip information of an IC chip for oscillation received via the first reception unit 112 (step S10). Next, the second reception unit 116 obtains, with a sample number of a sample oscillator and an oscillation circuit condition that are used for measurement, an oscillation frequency of an oscillation circuit measured when the customer configures a circuit at a circuit board to satisfy the sample oscillation circuit condition data and installs the sample oscillator at the circuit board (step S12). Next, the second provision unit 118 accesses the oscillation circuit matching DB 124 and determines matched oscillation circuit condition data in accordance with frequency measurement information obtained in step S12 (step S14). The second provision unit 118 provides the matched oscillation circuit condition data determined in step S14 for the customer (step S16). Accordingly, the process of this flowchart ends.

The oscillation circuit design support system 100 according to the present embodiment receives an input of IC chip information about an IC chip for oscillation, provides a customer with sample oscillator data and sample oscillation circuit condition data that are determined in accordance with the IC chip information, receives an input of input information including frequency measurement information about a value of a measured frequency measured in accordance with the sample oscillation circuit condition data when an oscillator corresponding to the sample oscillator data is installed at a circuit board, and provides the customer with information relating to matched oscillation circuit condition data determined in accordance with at least the frequency measurement information. As a result, without any need for the customer to provide the customer's circuit board for external business operators, the oscillation circuit condition in the circuit board can be optimized with consideration for differences of stray capacitance among circuit boards. This system optimizes the oscillation circuit while inhibiting information leakage about the circuit board to the outside.

Hereinafter, with supplementary description of part or all of embodiments of the present invention, effects thereof will be described. The present invention is not limited to the supplement described below.

An exemplary embodiment of the present invention provides an oscillation circuit design support method for supporting design of an oscillation circuit condition in a circuit board equipped with an IC chip for oscillation and an oscillator. The oscillation circuit design support method includes a first reception step of receiving an input of IC chip information about an IC chip for oscillation, a first provision step of providing sample oscillator data and sample oscillation circuit condition data that are determined in accordance with the IC chip information, a second reception step of receiving an input of frequency measurement information measured in accordance with the sample oscillation circuit condition data when an oscillator corresponding to the sample oscillator data is installed at a circuit board, and a second provision step of providing information relating to matched oscillation circuit condition data determined in accordance with at least the frequency measurement information.

According to an exemplary embodiment, the first provision step includes supplying an instruction to provide a sample oscillator in addition to the sample oscillator data and the sample oscillation circuit condition data.

According to an exemplary embodiment, the IC chip information is, for example, information about a product number of the IC.

According to an exemplary embodiment, the second reception step includes receiving an input of the sample oscillator data of the oscillator used to measure a frequency and an input of the sample oscillation circuit condition data used to measure the frequency measurement information in addition to the frequency measurement information.

According to an exemplary embodiment, the second provision step includes providing matched oscillation circuit condition data.

According to an exemplary embodiment, a step of obtaining previous support information for supporting design of the oscillation circuit condition is further included, and at least one of the first provision step and the second provision step is implemented in accordance with the previous support information.

Moreover, an exemplary embodiment of the present invention provides an oscillation circuit design support apparatus for supporting design of an oscillation circuit condition in a circuit board equipped with an IC chip for oscillation and an oscillator. The oscillation circuit design support system includes a first reception unit configured to receive an input of IC chip information about an IC chip for oscillation, a first provision unit configured to provide sample oscillator data and sample oscillation circuit condition data that are determined in accordance with the IC chip information, a second reception unit configured to receive an input of frequency measurement information about a value of a measured frequency measured in accordance with the sample oscillation circuit condition data when an oscillator corresponding to the sample oscillator data is installed at a circuit board, and a second provision unit configured to provide information relating to matched oscillation circuit condition data determined in accordance with at least the frequency measurement information.

In addition, an exemplary embodiment of the present invention provides an oscillation circuit design support program executable by a computer. The oscillation circuit design support program includes a first reception operation of receiving an input of IC chip information about an IC chip for oscillation, a first provision operation of providing sample oscillator data and sample oscillation circuit condition data that are determined in accordance with the IC chip information, a second reception operation of receiving an input of frequency measurement information about a value of a measured frequency measured in accordance with the sample oscillation circuit condition data when an oscillator corresponding to the sample oscillator data is installed at a circuit board, and a second provision operation of providing information relating to matched oscillation circuit condition data determined in accordance with at least the frequency measurement information.

As described above, an exemplary embodiment of the present invention optimizes the oscillation circuit while inhibiting information leakage about the circuit board to the outside.

In general, it is noted that the exemplary embodiments described above have been made for ease of understanding the present invention and should not be construed to limit the present invention. The exemplary embodiments can be changed or improved without departing from its spirit and also includes equivalents thereof. This means that modifications to the embodiments designed by those skilled in the art as appropriate are also embodied in the scope of the present invention when the modifications have features of the present invention. For example, the elements included in the embodiments, the arrangements thereof, materials, conditions, shapes, sizes are not limited to the examples and may be changed as appropriate. Furthermore, the elements included in the embodiments can be combined with each other when technically possible and combinations thereof may be encompassed in the scope of the present invention when the combinations have features of the present invention.

REFERENCE SIGNS LIST 10 input device
20 display device
100 oscillation circuit design support system
110 control unit
112 first reception unit
114 first provision unit
116 second reception unit
118 second provision unit
120 storage unit
122 sample information DB
124 oscillation circuit matching DB
126 customer information DB

The invention claimed is:
1. An oscillation circuit design support method for designing an oscillation circuit condition in a circuit board equipped with an integrated circuit (IC) chip for oscillation and an oscillator, the oscillation circuit design support method comprising:
receiving an input of IC chip information relating to an IC chip for oscillation;

providing sample oscillator data and sample oscillation circuit condition data that are determined based on the received IC chip information;

receiving an input of frequency measurement information that is measured based on the sample oscillation circuit condition data when an oscillator corresponding to the sample oscillator data is installed at a circuit board; and providing information relating to matched oscillation circuit condition data that is determined based on at least the inputted frequency measurement information.

2. The oscillation circuit design support method according to claim 1, wherein the providing of the sample oscillator data and the sample oscillation circuit condition data includes supplying an instruction to provide a sample oscillator in addition to the sample oscillator data and the sample oscillation circuit condition data.

3. The oscillation circuit design support method according to claim 1, wherein the IC chip information is related to a product number of the IC chip for oscillation.

4. The oscillation circuit design support method according to claim 1, wherein the receiving of the frequency measurement information includes receiving an input of the sample oscillator data of the oscillator used to measure a frequency and an input of the sample oscillation circuit condition data used to measure the frequency in addition to the frequency measurement information.

5. The oscillation circuit design support method according to claim 1, further comprising:
obtaining previous support information for designing of the oscillation circuit condition; and
providing the sample oscillator data and the sample oscillation circuit condition data based on the previous support information.

6. The oscillation circuit design support method according to claim 1, further comprising:
obtaining previous support information for designing the oscillation circuit condition; and
providing the information relating to the matched oscillation circuit condition data based on the previous support information.

7. The oscillation circuit design support method according to claim 1,
wherein, in the sample oscillation circuit condition data, one or more parameters comprising an oscillation circuit condition are associated with the sample oscillator data in an individual manner,
wherein the providing of the information relating to the matched oscillation circuit condition data is based on the oscillation circuit condition including the one or more parameters associated with the sample oscillator data of the oscillator used to measure the frequency measurement information.

8. The oscillation circuit design support method according to claim 1, further comprising displaying, on a display device, an image that indicates an optimized oscillation circuit condition as the matched oscillation circuit condition data.

9. The oscillation circuit design support method according to claim 1, wherein the matched oscillation circuit condition data comprises at least one of a capacitance of a capacitor in the oscillator, a resistance of a resistor, a load capacitance of the oscillator, a specification value of equivalent series resistance, and an IC internal resistance of the oscillator.

10. An oscillation circuit design support system for designing an oscillation circuit condition in a circuit board equipped with an IC chip for oscillation and an oscillator, the oscillation circuit design support system comprising:

a first reception unit configured to receive an input of IC chip information relating to an IC chip for oscillation;

a first provision unit configured to provide sample oscillator data and sample oscillation circuit condition data that are determined based on the received IC chip information;

a second reception unit configured to receive an input of frequency measurement information about a value of a measured frequency measured based on the sample oscillation circuit condition data when an oscillator corresponding to the sample oscillator data is installed at a circuit board; and a second provision unit configured to provide information relating to matched oscillation circuit condition data that is determined based on at least the inputted frequency measurement information.

11. The oscillation circuit design support system according to claim 10, wherein the first provision unit is further configured to supply an instruction to provide a sample oscillator in addition to the sample oscillator data and the sample oscillation circuit condition data.

12. The oscillation circuit design support system according to claim 10, wherein the IC chip information is related to a product number of the IC chip for oscillation.

13. The oscillation circuit design support system according to claim 10, wherein the second reception unit is further configured to receive an input of the sample oscillator data of the oscillator used to measure a frequency and the sample oscillation circuit condition data used to measure the frequency in addition to the frequency measurement information.

14. The oscillation circuit design support system according to claim 10, wherein the first provision unit is further configured to provide the sample oscillator data and the sample oscillation circuit condition data based on previous support information for designing of the oscillation circuit condition.

15. The oscillation circuit design support system according to claim 10, wherein the first provision unit is further configured to provide the information relating to the matched oscillation circuit condition data based on previous support information for designing of the oscillation circuit condition.

16. The oscillation circuit design support system according to claim 10,
wherein, in the sample oscillation circuit condition data, one or more parameters comprising an oscillation circuit condition are associated with the sample oscillator data in an individual manner, and
wherein the second provision unit is further configured to provide the information relating to the matched oscillation circuit condition data based on the oscillation circuit condition including the one or more parameters associated with the sample oscillator data of the oscillator used to measure the frequency measurement information.

17. The oscillation circuit design support system according to claim 10, further comprising a display device configured to display an image that indicates an optimized oscillation circuit condition as the matched oscillation circuit condition data.

18. The oscillation circuit design support system according to claim 10, wherein the matched oscillation circuit condition data comprises at least one of a capacitance of a capacitor in the oscillator, a resistance of a resistor, a load capacitance of the oscillator, a specification value of equivalent series resistance, and an IC internal resistance of the oscillator.

19. An oscillation circuit design support program executable by a computer, that, when executed by a processor of the computer, is configured to:
- receive an input of IC chip information relating to an IC chip for oscillation;
- provide sample oscillator data and sample oscillation circuit condition data that are determined based on the received IC chip information;
- receive an input of frequency measurement information about a value of a measured frequency that is measured based on the sample oscillation circuit condition data when an oscillator corresponding to the sample oscillator data is installed at a circuit board; and
- provide information relating to matched oscillation circuit condition data that is determined based on at least the inputted frequency measurement information.

20. The oscillation circuit design support program according to claim 19, wherein the program, when executed by the processor of the computer, is further configured to supply an instruction to provide a sample oscillator in addition to the sample oscillator data and the sample oscillation circuit condition data.

* * * * *